United States Patent [19]

Strubbe

[11] Patent Number: 4,933,589
[45] Date of Patent: Jun. 12, 1990

[54] IMPACT DETECTORS

[75] Inventor: Gilbert J. I. Strubbe, Zedelgem, Belgium

[73] Assignee: Ford New Holland, Inc., New Holland, Pa.

[21] Appl. No.: 335,620

[22] Filed: Apr. 10, 1989

[30] Foreign Application Priority Data

Apr. 26, 1988 [EP] European Pat. Off. ...... 88.200.803.0

[51] Int. Cl.⁵ .............................................. H01L 41/08
[52] U.S. Cl. .................................... 310/323; 310/321; 310/324; 340/674
[58] Field of Search ................................ 310/321-324, 310/326, 345, 328-332, 334, 336; 340/267 R, 259, 261, 590, 691, 603-610; 73/649, 598, DIG. 4

[56] References Cited

U.S. PATENT DOCUMENTS

| | | | |
|---|---|---|---|
| 3,808,364 | 4/1974 | Veith | 310/328 X |
| 4,004,289 | 1/1977 | Kirk | 340/267 R |
| 4,048,454 | 9/1977 | Barcus et al. | 310/322 X |
| 4,061,934 | 12/1977 | Rowe | 310/323 |
| 4,079,362 | 3/1978 | Grimm et al. | 310/321 X |
| 4,401,909 | 8/1983 | Gorsek | 310/323 |
| 4,527,105 | 7/1985 | Shiraishi | 310/324 X |
| 4,705,981 | 11/1987 | Inoue et al. | 310/322 X |
| 4,835,435 | 5/1989 | Yeung et al. | 310/323 X |

FOREIGN PATENT DOCUMENTS

| | | |
|---|---|---|
| 0117587 | 9/1984 | European Pat. Off. . |
| 2044266 | 3/1971 | Fed. Rep. of Germany . |
| 2632507 | 4/1977 | Fed. Rep. of Germany . |
| 2208593 | 6/1974 | France . |
| 2287159 | 10/1975 | France . |
| 2002903 | 2/1979 | United Kingdom . |
| 1561110 | 2/1980 | United Kingdom . |
| 2103796 | 2/1983 | United Kingdom . |

Primary Examiner—Mark O. Budd
Attorney, Agent, or Firm—Larry W. Miller; Frank A. Seemar; Darrell F. Marquette

[57] ABSTRACT

An impact detector for use with a grain loss monitor of a harvesting machine includes a damped detector plate member and a transducer associated with a surface of said detector plate member. The detector plate member is provided with signal damping means only around its periphery, whereby a substantial area of the detector plate member is delimited which is void of any signal damping means.

17 Claims, 2 Drawing Sheets

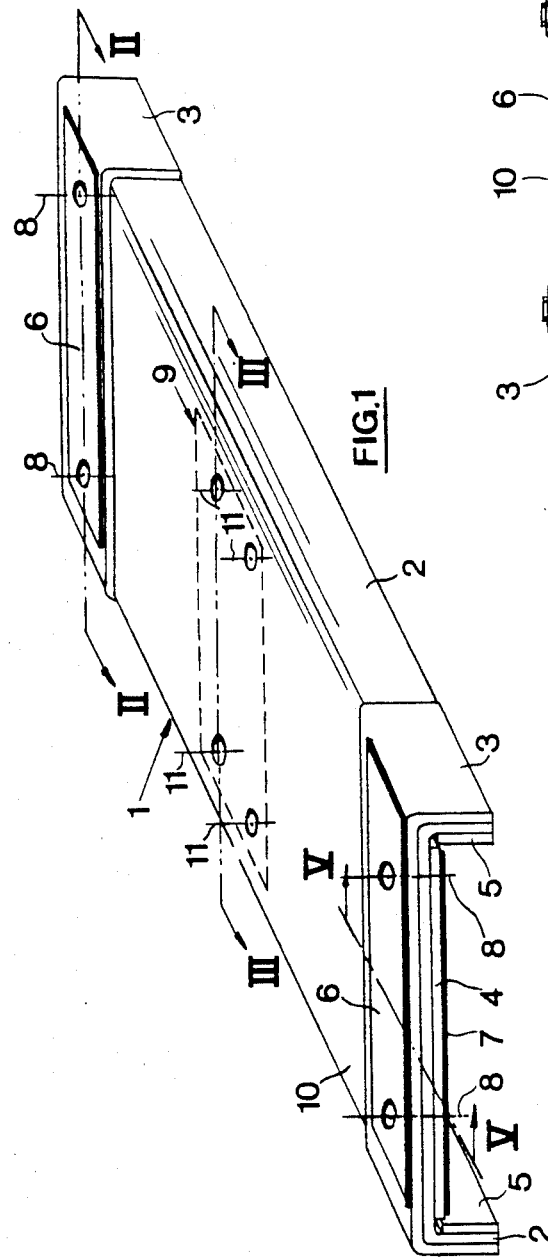
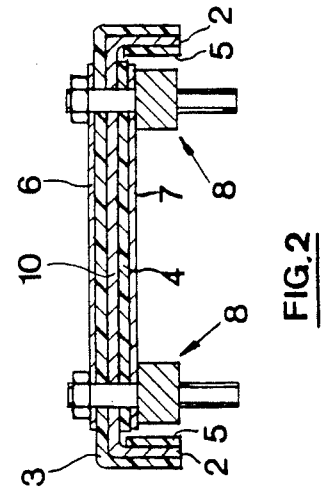
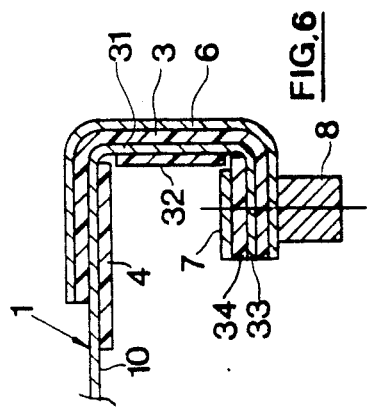
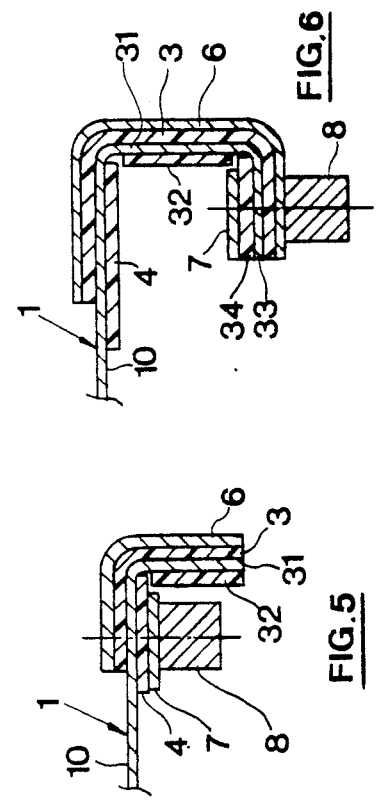

IMPACT DETECTORS

BACKGROUND OF THE INVENTION

This invention relates to impact detectors particularly, although not exclusively, for use with grain loss monitors for combine harvesters. Such impact detectors are used to give an indication to the machine operator of the amount of grain which is being lost either by way of being entrained in the straw which is discharged from the combine separating mechanism to the ground or by way of being discharged together with chaff and other impurities from the combine cleaning apparatus. Throughout this specification the reference to "grain" is intended to refer to that part of the crop which is threshed and separated from the discardable part of the crop which is referred to as "straw".

There are a number of problems associated with existing grain loss monitors and perhaps the most important problem is that there is not available a monitor which will indicate, in absolute terms, the amount of grain being lost during the harvesting process. However, the present invention nevertheless does not address this particular problem but rather the problems related to the variations in the sensitivity across the length of the detector surface of some known impact detectors on the one hand and to an insufficient detection rate capacity of other known impact detectors on the other hand.

One such impact detector manufactured by the Applicant is shown in EP-A-0.117.587 and is in the form of a plate of a synthetic plastics material which is set within a hollow metallic mount and is isolated therefrom on all sides. This sensing plate has dimensions in the range of e.g. 15 cm×7 cm and as such is rather small. Between the synthetic plastics plate and the base of the hollow mount, there is provided a damping material in the form of a sheet of foamed synthetics material (although other types of damping material may be employed). This damping sheet extends over the entire undersurface of the synthetic plastics detector plate. A crystal transducer is attached to the underside of the synthetics plate in the centre thereof.

The aforementioned damping sheet is intended to eliminate, to the extent possible, the transfer of machine vibrations from the metallic mount to the synthetic plastics material sensor plate and thus also to the transducer attached thereto. Problems which arise with such a detector include a reduction of the overall sensitivity thereof due to the foamed synthetics mounting material also dampening the vibrations within the sensor plate induced by the impacts to be detected. Furthermore, the sensitivity also widely varies across the surface of the sensor plate, which may be in part because the useful sensitive area is relatively small and is centred on the crystal transducer. These problems, in part, also are due to and are aggravated by the fact that the synthetic plastics material of the sensor plate has only a small vibration conductivity.

The foregoing means that, to date, quite often, a plurality of detectors have had to be employed across the width of the harvester at the point or points where grain loss is to be monitored. Typically, such points would be the end of the straw walkers and the end of the upper cleaning sieve in a conventional combine harvester.

In another known arrangement, the sensor plate is similar to the sensor plate described hereabove but with the difference being that this sensor plate (with the crystal transducer attached thereto) is mounted within a hollow metallic mount via foamed synthetic material that is provided only adjacent the circumferential edges of the sensor plate. This foamed synthetic material provided circumferentially at the edges of the sensor plate again is intended to isolate the sensor plate from the machine vibrations to the extent possible and accordingly is specifically selected for this purpose. The problems associated with this impact detector are of a similar nature as the problems described hereabove and associated with the impact detector of EP-A-0.117.587. In other words, the overall sensitivity is low and moreover the sensitivity widely varies across the surface of the detector plate.

In an attempt to overcome these problems the synthetic material sensor plate of the foregoing prior art impact detector has been replaced by a metallic sensor plate of substantially the same relatively small dimensions. Metal indeed has a much higher vibration conductivity. However, this leads to other problems in as much as any impact on the metallic sensor plate generates a signal which lasts a comparatively long time because it is transmitted along and across the plate and then is reflected back from the respective edges of the plate. Accordingly a "ringing" of the signals takes place which results in a saturation of the detector at a low detection rate. As a further result, this detector with a metallic sensor plate is unable to adequately "count" high signal rates. This "ringing" effect is not influenced, i.e. is not reduced to any substantial degree, by the foamed synthetic mounting material provided at the outer edges of the sensor plate for attaching the same to the mount. This foamed synthetic material has been selected for its characteristic of being able to isolate to a great extent the sensor plate from the machine vibrations.

In still another arrangement a single impact detector is provided which comprises a detector plate member or sensor plate which extends across substantially the full width of the machine and to which crystal transducers are attached at intervals of about 20 cm. This brings about still other problems which are associated with the fact that the absolute sensitivity of individual transducers may be widely different, so that the sensitivity across the total surface of the sensor plate also may be very irregular for this reason alone. Electronic conditioning of the individual transducers may overcome this problem; however, this leads to a very complex and expensive apparatus which equally is not acceptable. Hence, a simplier approach is applied by which the signals of all transducers are amplified proportionally.

In connection with the foregoing it also should be kept in mind that impact detectors used with grain loss monitors should be able to discriminate between signals generated by grain kernals and signals generated by pieces of straw. Grain kernals generate a signal with a somewhat larger amplitude than straw pieces in any given transducer. Accordingly, it is possible to discriminate between these signals generated by any given transducer. However, if output signals of transducers with different absolute sensitivity levels are applied to the same electronic circuitry, it may be that the signals generated by straw pieces in the more sensitive transducers may come close to the signals generated by grain kernals in the less sensitive transducers. Accordingly, a problem may arise in this area to the extent that it may no longer be possible to clearly distinguish between all the signals.

This problem is also aggravated by the varying sensitivity distribution across the surface of the sensor plate at varying distances from each individual transducer. As already mentioned, the sensitivity indeed is much higher in the immediate vicinity of the transducer than at a relatively short distance (e.g. 15 cm) from said transducer. It therefore may be necessary, for guaranteeing a reading for all grain kernal impacts irrespective of where the impacts take place relative to each individual transducer, to lower the sensitivity threshold. However, this also may result in the fact that any one of the more sensitive transducers also will record straw impacts for grain impacts.

The combination of all the foregoing results in the fact that the adjustment of the average sensitivity of a multi-transducer impact detector is very critical. In other words, any average sensitivity setting may at the same time be too high for some transducers whereby these transducers also count straw impacts and too low for some other transducers whereby these other transducers of the same impact detector are unable to detect the more "remotely" positioned grain impacts. This is of course unacceptable in as much as it greatly affects the accuracy of the grain loss indication.

In still another prior art arrangement, a single metallic sensor plate has been provided which equally extends across the full width of the combine harvester. Because of the high vibration conductivity of metal, the sensitive area around the transducers is greatly widened in such impact detectors. This may be even to the extent that no more than one transducer is needed for a full width detector plate. However, as already indicated, there again are other problems associated with this type of impact detectors as well. Indeed, the high vibration conductivity of metallic sensor plates leads to the disturbance of the original impact vibrations caused by echoes of these vibrations at the edges of the sensor plate. In other words, any impact vibration within the detector plate "rings" much too long whereby premature saturation is obtained as has already been described hereabove. Accordingly, such impact detectors may be used only at locations and under circumstances where only low level grain flow rates may be expected. In other words, such an impact detector may not be used underneath a threshing or separating concave of a combine harvester for providing an indication of the grain flow rate (as opposed to the grain loss level) at this location.

SUMMARY OF THE INVENTION

The object of the present invention is to provide an impact detector having improved sensitivity characteristics including increased sensitivity, a more regular distribution of the sensitivity across the entire surface of the sensor plate and a much increased detection rate before saturation occurs whereby the impact detector can be used in a wider range of applications than was hereto possible, such as the installation of the impact detector underneath the threshing and separating concaves of a combine harvester for monitoring the grain separation therethrough.

According to the present invention there is provided an impact detector such as for use with a grain loss monitor and comprising a damped detector plate member of the type having a high signal (i.e. vibration) conductivity and a transducer associated with a surface of the detector plate member. The signals induced in this impact detector are in the form of vibrations. The impact detector is characterized in that the detector plate member is provided with signal damping means substantially around its periphery delimiting thereby a substantial area thereof which is void of any signal damping means; said signal damping means being capable of damping signal echoes within the detector plate member at the outer edges thereof. In this combination a high signal conductivity is maintained across substantially the entire impact surface of the detector plate member whereby a more evenly distributed sensitivity across said operative sensor surface is obtained. At the same time the signal duration resulting from any impact is very substantially shortened due to the elimination of disturbing signal echoes and whereby, in turn, saturation correspondingly also is very much delayed; i.e. the impact detector according to the invention has a very much higher detection rate capability.

This signal damping means may be provided around the periphery of the detector plate member on either one or both of the opposed surfaces thereof. In a preferred embodiment, the detector plate member comprises a metallic plate of generally U-shaped cross-section with the limbs thereof being provided with signal damping means on the inner surface thereof and with further signal damping means provided on each of the two opposed surfaces of the detector plate member at respective opposite ends thereof.

Preferably, the transducer is mounted on the side of the detector plate member opposite to the side which is subjected to the impacts to be detected. Also preferably, the transducer is part of a transducer package which itself is mounted on said side of the detector plate member opposite to the side which is subjected to the impacts to be detected. Said transducer package includes a secondary metallic plate member with which the transducer is associated and which is attached to the detector plate member at locations spaced from the transducer means. Said secondary metallic plate may be provided with signal damping means either around its periphery or substantially over its entire surface opposite to that surface which is facing the detector plate member. Furthermore said transducer package may be removably attachable to the detector plate member by attaching members provided at locations spaced from the transducer means and whereby a standard transducer package can be produced for use with any size of detector plate member. Also the external circuitry connected to the transducer may form part of the transducer package.

BRIEF DESCRIPTION OF THE DRAWINGS

An impact detector constructed in accordance with the present invention and for use with a grain loss monitor for a combine harvester will now be described in greater detail, by way of example, with reference to the accompanying drawings, wherein:

FIG. 1 is a schematic perspective view of the detector;

FIG. 2 is a cross-sectional view taken along line II—II of FIG. 1;

FIGS. 5 and 6 are partial, cross-sectional views on line V—V of FIG. 1, but illustrating alternative embodiments of the impact detector according to the present invention.

DETAILED DESCRIPTION OF THE PREFERRED EMBODIMENT

Figure 4:
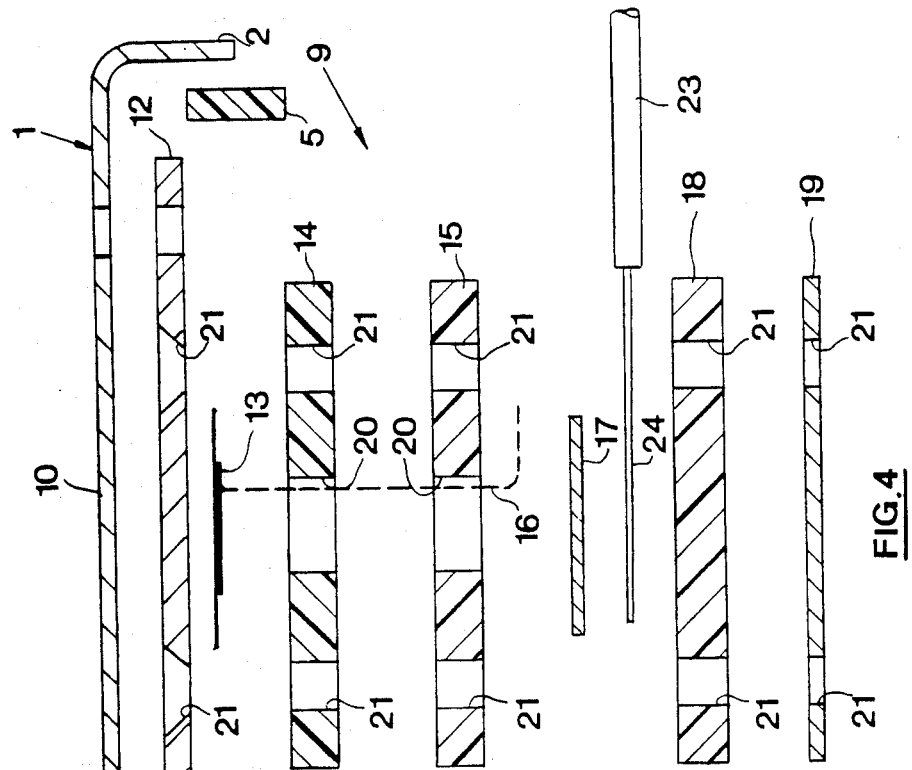
FIG. 4 is an enlarged, exploded view of FIG. 3, with certain components removed for purposes of clarity.

With reference to FIGS. 1-4, the detector illustrated therein is designed for a grain loss monitor such as that disclosed in co-pending U.S. patent application No. . . . filed concurrently herewith and entitled "Grain Loss Monitors for Harvesting Machines," the descriptive portions of which are incorporated herein by reference. However, this impact detector may also be used to advantage in other applications.

Referring to the FIGS. 1-4, the impact detector comprises a detector plate 1 in the form of a stainless steel plate of generally U-shaped cross-section with a main body 10 and with limbs or flanges 2 thereof extending along the opposed longer sides of the main body 10. The main body 10 of the detector plate 1 is 10 cm wide and the flanges 2 are 2.5 cm high. The detector plate 1 may be of any length from e.g. approximately 25 cm to 170 cm, according to the application and the combine width.

The detector plate 1 is provided with signal damping means substantially around its entire periphery; these damping means being applied on the opposite sides of the detector plate 1 at the opposite ends thereof on the one hand and only on one side along the flanges 2 on the other hand. More specifically, at each opposite end of the detector plate 1, there is provided a strip 3 of damping material of a comparative width of approximately 3 cm and of a comparative thickness of approximately 0.5 cm and which extends across the top of the main body 10 and down the exterior of the flanges 2. A further strip of damping material 4 of similar width and thickness extends at each opposite end across only the main body 10 of the detector plate 1 on the underside thereof. A further strip 5 of damping material again of similar thickness, is provided along each flange 2 of the detector plate 1 along the interior face of this flange 2.

Ideally, the flanges 2 would also have a strip of damping material provided on the exterior faces thereof but, if this were done, these exterior strips of damping material would be open to attack by grain and straw falling on the detector plate 1 and would thus become worn very quickly and eventually stripped from the plate. Furthermore, these exterior strips of damping material might hinder the flow of crop material and thus cause a build up thereof, possibly resulting in blockage. The strip 3 of damping material provided across the top of the detector plate 1 at the opposite ends thereof are protected in this respect, by metal plates 6. Corresponding plates 7 are provided on the damping strips 4. These metal plates 6 and 7 further also form supports for anti-vibration (AV) mounts 8 (FIG. 2) used to mount the detector plate 1 on the combine harvester at the required location.

Figure 3:
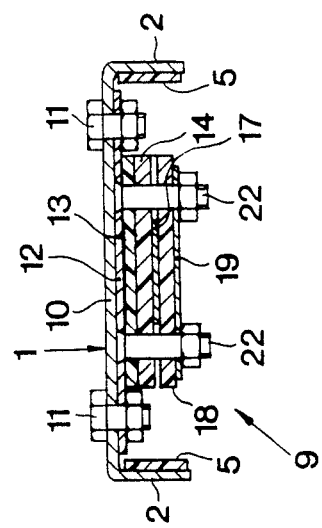
FIG. 3 is a cross-sectional view taken along line III—III of FIG. 1.

Centrally of the length of the detector plate 1 and on the underside thereof, there is provided a single transducer package indicated generally at 9. This package is bolted to the detector plate 1 by bolts 11 which are seen in FIG. 3 of the drawings. Referring both to FIG. 3 and to FIG. 4 of the drawings, the transducer package 9 comprises a stainless steel plate 12 by which the package is bolted to the underside of the detector plate 1. On the underside of this plate 12 there is provided a crystal transducer 13 which is held in close contact with the plate 12 by a sheet of damping material 14 which in turn is backed by a sheet of rubber or other resilient material 15. The crystal transducer 13 may be glued to the sheet of damping material 14 so as to facilitate the correct positioning thereof during assembly.

The two sheets of material 14 and 15 are provided with a central aperture 20 through which the lead 16 from the positive pole of the crystal transducer 13 is taken; the negative pole of the transducer (not shown) being held in contact with the stainless steel plate 12. The end of the lead 16 is stripped so as to be in electrical contact, in the one embodiment shown in FIGS. 3 and 4, with a copper plate 17 which is sandwiched between a first rubber sheet 15 and a second rubber sheet 18. The transducer package 9 is completed by a further stainless steel plate 19. The components 12, 14, 15, 18 and 19 are provided with aligned apertures 21 by which they are secured together by bolts 22 having countersunk heads which are received by the appropriately shaped apertures 21 in the stainless steel plate 12.

The electrical signal from the crystal transducer 13 is taken from the transducer package 9 by a lead 23, the end 24 of which is stripped of insulation and sandwiched between the copper plate 17 and the rubber sheet 18. Accordingly, this end 24 of the lead 23 is in electrical contact with the positive pole of the transducer 13 via the copper plate 17 and the stripped end of the transducer lead 16. The lead 23 is taken to a printed circuit board containing certain components of the processing circuitry which is referred to in the above mentioned co-pending U.S. patent application of even date entitled "Grain Loss Monitors for Harvesting Machines." In an alternative arrangement, the lead 23 may be eliminated in as much as the printed circuit referred to above may be sandwiched with one end between the copper plate 17 and the rubber sheet 18 in a manner so as to make direct electrical contact between the copper plate 17 and the input of the printed circuit. Eventually, also the copper plate may be eliminated in as much as the transducer lead 16 may make direct electrical contact with the input of the printed circuit as the printed circuit has one end sandwiched between the sheets 15 and 18. The printed circuit board in this latter arrangement, thus is attached to the transducer package 9 by way of being sandwiched with one end between certain components of the transducer package 9 and by using the bolts 22 therefore so that it is not attached directly to the detector plate 1.

The material used for the damping strips 3, 4 and 5 and for the damping sheet 14 of the transducer package 9 is preferably that manufactured by Trelleborg AB under the trade name NOVIBRA but other forms of damping material may be employed. More particularly, a damping material should be selected that is capable of damping vibrations within the detector plate member. This is a different material than the foamed synthetic material used in the prior art for mounting the detector plate onto a support or mount; this material being selected for its capability of greatly reducing the transfer of machine vibrations from the mount to the detector plate. Such a foamed synthetic mounting material does not damp to any substantial degree the signal vibrations within the detector plate. It should also be remarked that the damping strips 3, 4, 5 according to the present invention, unlike the foamed damping material applied in prior art arrangements do not attach the detector plate 1 to any mount, even though the anti-vibration mounts 8 indirectly are coupled to the damping strips 3, 4 at the opposite ends of the detector plate member 1.

The specific functions of the damping strips 3, 4, 5 on the one hand and the anti-vibration mounts 8 on the other hand are quite different.

Indeed, the visco-elastic damping material used in the present invention has a relatively high nominal weight, a low flexural rigidity and a high inherent attenuation ability whereby it is particularly suited for damping structure-born vibrations within the material to which it is attached. Such visco-elastic damping material thus is suited to damp relatively high frequency vibrations such as in the range of e.g. 5-20 khz. Such damping material is known in the art, for example from the application of noice insulating coating applied on the inner surface of engine hoods in cars.

In contrast therewith the foamed synthetic material previously used for mounting the detector plate on a support is a visco-elastic damping material with a relatively low nominal weight, a high flexibility and an outspoken ability for, when used for attaching one material to another material, preventing the transfer of vibrations from this one material to the other material via said mounting material. This type of damping material thus is designed to absorb relatively low frequency vibrations.

Each detector plate 1 is mounted in the combine harvester, or other harvesting machine, preferably in such a manner that they are positioned at about 30° to 35° to the tangent of the rotary component with which they are associated, where that is appropriate. This orientation of the detector plate 1 is more specifically disclosed in co-pending U.S. patent application No. . . . of even date and entitled "Method and Apparatus for Measuring Grain Loss in Harvesting Machines," the description of which is hereby incorporated herein by reference. This orientation is preferred in order to avoid impacts upon the detector surface at right angles by grain and straw which issues straight radially out of the concave. Apart from this orientation of the detector plate relative to the tangent as described, it is also necessary to position the detector plate at an angle of at least 35° relative to the horizontal so as to avoid accumulation of material on top of the impact surface thereof. The detector plate 1 may also be similarly oriented relative to the path of material coming off the straw walkers when applied on a straw walker type combine harvester.

It will be seen that, in accordance with the present invention, a detector plate 1 is provided which is damped essentially only around the entire periphery thereof; i.e. such as to leave a comparatively large area of the plate undamped. Thereby, the high conductivity of the undamped inner portion of the detector plate member 1 remains substantially unaffected so that a more-or-less constant level of sensitivity is maintained across the entire operative sensor surface of the detector plate. This thus also increases the ability to detect impacts over the entire undamped area.

In other words, it thus has been found that the present invention provides an impact detector which has a relatively linear and constant sensitivity distribution over the whole of the undamped area thereof. This is in contrast to known detectors which have a very limited area of high sensitivity which is centred on the transducer with the surrounding area being substantially less sensitive. The relatively high degree of linearity and evenness of the sensitivity distribution as achieved with the present invention to some extent came as a surprise and is therefore an unexpected advantage arising out of the present invention. This advantage can be exploited by way of reducing the number of detectors which are required in a given application. For example, whereas some known detectors, in view of the low sensitivity thereof, previously had to have detector plates of a rather short length mounted at short intervals across the width of the combine harvester, it is now possible to provide a single detector extending across the full width of the combine harvester and thus having a length in the order of up to 170 cm or even more so that one detector can take the place of a plurality of known detectors.

The sensitivity characteristics referred to above are derived at least in part from the provision of a transducer package such as that illustrated at 9 in the accompanying drawings. It should be noted that, if the transducer 13 were to be mounted directly onto the detector plate 1, there would be a small area of approximately 5 cm in all directions around the transducer which would demonstrate a much increased sensitivity to impacts compared with the remainder of the undamped area of the detector plate 1. Accordingly, it is a preferred feature of the present invention to mount the transducer 13 indirectly on the detector plate 1 via another plate such as the plate 12 shown in FIGS. 3 and 4 of the accompanying drawings. It appears that, because the contact between these two plates 1 and 12 is greater at the regions of the securing bolts 11, any impact on the main detector plate 1 is transmitted to the secondary plate 12 via the bolts 11 and not directly.

Accordingly, this phenomenon helps in reducing the sensitivity peak in the immediate vicinity of the transducer 13, thus making the sensitivity substantially even and linear over substantially the entire undamped area of the detector plate 1. It will be noted that the secondary or subsidiary plate 12 is damped over substantially its entire undersurface by the sheet of damping material 14, save for the central aperture 20 which is provided for the through passage of the detector lead 16. Ideally, the secondary or subsidiary plate 12 also would be damped only around its periphery in a manner similar to the main detector plate 1 but when this would be done, a larger plate 12 would be required and, in the illustrated application of the present invention, there is not sufficient room to accommodate such a secondary plate of increased size. The extra attenuation of a signal resulting from the impact on the detector plate 1 brought about by the full size damping sheet 14 can be accomodated without difficulty in the illustrated application of the grain loss monitor.

Simultaneously with the improved sensitivity distribution achieved with the present invention, the damping strips 3, 4, 5 provided generally at the outer edges of the detector plate member 1 also greatly reduce the reflections at said outer edges of any signal vibrations induced within the detector plate member 1 by the impact to be detected. If this damping were not provided at the periphery of the detector plate 1, then saturation would soon be achieved because the signal resulting from one impact would last or "ring" a comparatively long time because it would be transmitted along and across the plate and would then be reflected back from the respective edges thereof. Accordingly, a given signal still could be "ringing" when a second signal is already generated by another impact.

It is normally not possible to distinguish between two such signals and hence, saturation is achieved with existing detectors at a relatively early stage in terms of impacts per unit time. However, with the present invention, the "ringing" of a signal resulting from a given impact is of a much shortened duration which thus improves dramatically the ability of the detector to detect a relatively large number of impacts per unit time. For example, whereas an undamped plate can result in a signal "ringing" for up to 10 milliseconds, the damping provided by the present invention reduces that ringing to approximately 1 millisecond and sometimes to as little as 0.3 milliseconds for wheat, for example. Even with signal durations of 1 millisecond, this means that ten times the number of impacts can be detected, with assurance, compared with a plate which is undamped and has a signal ringing duration of 10 milliseconds.

It also has been noticed that in a detector plate with a high signal conductivity and which is not provided with any damping means at its periphery, the aforedescribed signal echoes adversely affect the sensitivity distribution across the surface of the detector plate member. It is almost like there are "holes" in the sensitivity distribution which result in "blind" spots in the detector plate surface and where impacts cannot be read.

As far as the damping of the secondary plate member 12 of the transducer assembly 9 is concerned, it should be noted that the damping material not only damps said secondary plate member 12 but also the housing containing the crystal transducer 13. Experiments have shown that this additional damping positively contributes to both the shortening of the signals and the leveling out of any peaks in the signals recorded by the transducer.

In summary, the improvement in sensitivity of an impact detector brought about by the present invention also means that saturation does not occur as early as with well known detectors. This, in turn, also means that the detector can be used in locations where the density of grain is much greater than at the end of the straw walkers, for example. This particular feature of the present invention is exploited to the full in providing an apparatus for measuring actual grain loss as disclosed in the aforementioned co-pending U.S. application No. . . . entitled "Method and Apparatus for Measuring Grain Loss in Harvesting Machines."

The use of a transducer package 9 as described above further also gives rise to the following additional advantages:

1. A separate standard unit which is readily attachable to any practical size of main detector plate.
2. Signal damping to a maximum of around 2 milliseconds.
3. Control of the resonant frequency.
4. Absence of soldered joints for the electrical connections.
5. A robust and weatherproof construction.

While the preferred structure, in which the principles of the present invention have been incorporated, is shown and described above, it is to be understood that the invention is not to be limited to the particular details as shown and described above, but that, in fact, widely different means may be employed in the practice of the broader aspects of the invention.

As an example it is to be understood that, while in the preferred embodiment, the impact detector comprises only one transducer package, it nevertheless also is possible to provide two or more transducer packages in an impact detector without departing from the invention. Similarly, the detector plate member need not necessarily be made of stainless steel in as much as any type of material can be utilized provided it has a high signal conductivity. Also, either the damping sheet 14 or the rubber sheet 15 of the transducer package 9 may be left out although again the embodiment as shown in the drawings is the preferred embodiment.

With reference to FIGS. 5 and 6, it will be noticed that the particular shape of the detector plate member 1 itself also may be changed without departing from the spirit of the invention. Considering first FIG. 5, it will be seen that the detector plate member 1 additionally also may have flanges 31 at the transversely opposite ends thereof and which extend at 90° relative to the detector main body 10. The damping strips 3, in this case, also extend across the top of the main body 10 and down along the exterior of the flanges 31. Similarly the protective metal plates 6 equally may curve around the opposite ends of the detector plate member 1 and down alongside the additional flanges 31. Further damping strips 32 additionally also may be provided on the inner faces of the flanges 31.

In comparison with the arrangement according to FIG. 5, the arrangement according to FIG. 6 goes even one step further in as much the flanges 31, at the opposite ends of the detector plate member 1, are extended with another portion 33 provided at another 90° relative to the flanges 31 and projecting back inwardly. The damping strips 3 and the corresponding protective metal plates 6 equally are similarly extended. Still another damping strip 34 is attached to the inner face of each extension portion 33. The anti-vibration mounts 8, in this case, are connected to the extension portions 33 and, to this end, protective metal plates 7 are provided on top of the further damping strips 34.

Having thus described the invention, what is claimed is:

1. In an impact detector for use with a grain loss monitor and including a damped detector plate member having a high signal conductivity and a transducer associated with a surface of the detector plate member, the improvement comprising:
   the detector plate member is provided with signal damping means substantially around the periphery thereof delimiting a substantial area thereof which is void of any signal damping means, said signal damping means being capable of damping signal echoes within the detector plate member at the outer edges thereof, said detector plate member being an elongated metallic plate of generally U-shaped cross-section having limbs provided with said signal damping means on the inner surfaces thereof and with further damping means being provided on each of the two opposed surfaces of the detector plate member at the respective opposite ends thereof.

2. The impact detector of claim 1 wherein the detector plate member is provided with signal damping means around the periphery thereof on each one of the opposed surfaces thereof.

3. The impact detector of claim 1 wherein first shielding plate members are positioned on top of the further damping means provided, at the respective opposite ends of the detector plate member, on the side thereof that is subjected to the impacts to be detected.

4. The impact detector of claim 3 wherein second shielding plate members are positioned on top of the further damping means provided, at the respective opposite ends of the detector plate member, on the side thereof opposite to the side that is subjected to the impacts to be detected.

5. The impact detector of claim 4 wherein said detector plate member is apertured to receive anti-vibration mounts by which the detector can, in use, be mounted.

6. The impact detector of claim 5 wherein the apertures for receiving the anti-vibration mounts also extend through the further damping means and the first and second shielding plate members.

7. The impact detector of claim 3 wherein the transducer is mounted on the side of the detector plate member opposite to the side which is subjected to the impacts to be detected.

8. The impact detector of claim 7 wherein the transducer is part of a transducer package mounted on the side of the detector plate member opposite to the side which is subjected to the impacts to be detected, said transducer package including a secondary metallic plate member with which the transducer is associated and which is attached to the detector plate member at locations spaced from the transducer means.

9. The impact detector of claim 8 wherein the transducer package is removably attached to the detector plate member by attaching members provided at locations spaced from the transducer means.

10. The impact detector of claim 9 wherein the secondary plate member of the transducer package is provided with signal damping means around its periphery and at the side thereof opposite to the side which faces the detector plate member.

11. The impact detector of claim 9 wherein the secondary plate member of the transducer package is provided with signal damping means over substantially its entire surface opposite to that which is facing the detector plate member.

12. The impact detector of claim 11 wherein the transducer is a crystal transducer held in contact with the secondary plate member of the transducer package by said signal damping means of said transducer package.

13. The impact detector of claim 12 wherein the crystal transducer is glued to the signal damping means of the transducer package at the side of said damping means facing said secondary plate member.

14. The impact detector of claim 13 wherein an electrical lead from the transducer is placed in electrical contact with an electrically conductive member which is also in electrical contact with a further electrical lead by which a signal from the transducer is taken to an external circuitry, both of said electrical leads being maintained in electrical contact with the electrically conductive member by way of being sandwiched between that member and respective resilient members, said electrically conductive member and said resilient members forming part of said transducer package.

15. The impact detector of claim 13 wherein an electrical lead from the transducer is placed in electrical contact with an input of an external circuitry, said electrical lead and said input of the external circuitry being maintained in electrical contact with each other by way of said lead and said external circuitry at the input thereof being sandwiched between resilient members said external circuitry, said resilient members forming part of said transducer package.

16. The impact detector of claim 15 wherein the transducer package also comprises a mounting plate disposed relative to the secondary plate member of said package so as to sandwich said transducer package therebetween the secondary plate member, the damping means, the resilient members and the mounting plate being apertured to receive assembly members therethrough.

17. The impact detector of claim 16 wherein the damping means are made of visco-elastic damping material with a high nominal weight, a low flexural rigidity and a high inherent attenuation ability.

* * * * *